US010756535B2

(12) United States Patent
Tang et al.

(10) Patent No.: US 10,756,535 B2
(45) Date of Patent: Aug. 25, 2020

(54) COMBINED DIRECT CURRENT CIRCUIT BREAKER AND APPLICATION METHOD THEREOF

(71) Applicants: GLOBAL ENERGY INTERCONNECTION RESEARCH INSTITUTE CO., LTD., Beijing (CN); STATE GRID CORPORATION OF CHINA, Beijing (CN)

(72) Inventors: Guangfu Tang, Beijing (CN); Zhiyuan He, Beijing (CN); Wandi Zhou, Beijing (CN); Xiaoguang Wei, Beijing (CN); Sheng Zhang, Beijing (CN); Yan Zhao, Beijing (CN); Xiang Luo, Beijing (CN); Pengzhi Li, Beijing (CN)

(73) Assignees: GLOBAL ENERGY INTERCONNECTION RES. INST. CO., LTD., Beijing (CN); STATE GRID CORPORATION OF CHINA, Beijing (CN)

( * ) Notice: Subject to any disclaimer, the term of this patent is extended or adjusted under 35 U.S.C. 154(b) by 172 days.

(21) Appl. No.: 16/067,602

(22) PCT Filed: May 22, 2017

(86) PCT No.: PCT/CN2017/085281
§ 371 (c)(1),
(2) Date: Jun. 30, 2018

(87) PCT Pub. No.: WO2018/014646
PCT Pub. Date: Jan. 25, 2018

(65) Prior Publication Data
US 2019/0006838 A1    Jan. 3, 2019

(30) Foreign Application Priority Data

Jul. 20, 2016  (CN) .......................... 2016 1 0576055

(51) Int. Cl.
*H02H 7/22*  (2006.01)
*H02H 7/26*  (2006.01)
(Continued)

(52) U.S. Cl.
CPC .......... *H02H 7/268* (2013.01); *H01H 33/596* (2013.01); *H03K 17/162* (2013.01);
(Continued)

(58) Field of Classification Search
USPC .......................................... 361/2–13, 62–69
See application file for complete search history.

(56) References Cited

U.S. PATENT DOCUMENTS 9,000,623 B2 *  4/2015  Berggren ............... H02H 7/268
                                                       307/113
9,640,973 B2    5/2017  Rong et al.
(Continued)

FOREIGN PATENT DOCUMENTS

CN    103219699 A    7/2013
CN    103441490 A    12/2013
(Continued)

OTHER PUBLICATIONS

International Search Report in international application No. PCT/CN2017/085281, dated Jul. 21, 2017.
(Continued)

*Primary Examiner* — Danny Nguyen
(74) *Attorney, Agent, or Firm* — Syncoda LLC; Feng Ma

(57) ABSTRACT

A combined direct current circuit breaker includes a transfer branch, an energy absorption branch, at least two primary branches and at least two secondary branches; the transfer branch is connected in parallel with the energy absorption branch; the primary branches are in one-to-one correspondence with the second branches; the primary branches are connected with direct current outgoing lines of a direct
(Continued)

current busbar in a high-voltage direct current power transmission system; the secondary branches are connected in series with the transfer branches and then connected in parallel with two ends of the primary branches corresponding to the secondary branches.

12 Claims, 16 Drawing Sheets

(51) Int. Cl.
  *H01H 33/59*   (2006.01)
  *H03K 17/16*   (2006.01)
  *H02J 3/36*   (2006.01)
  *H02H 3/087*   (2006.01)
  *H02H 9/00*   (2006.01)
  *H02B 1/24*   (2006.01)

(52) U.S. Cl.
  CPC ............. *H03K 17/168* (2013.01); *H02B 1/24* (2013.01); *H02H 3/087* (2013.01); *H02H 7/22* (2013.01); *H02H 7/26* (2013.01); *H02H 9/005* (2013.01); *H02J 3/36* (2013.01); *H03K 2217/0009* (2013.01)

(56) References Cited

U.S. PATENT DOCUMENTS

| | | | | |
|---|---|---|---|---|
| 10,122,163 | B2 * | 11/2018 | Majumder | ................ H02J 1/10 |
| 2014/0217833 | A1 | 8/2014 | Rong et al. | |
| 2015/0002977 | A1 * | 1/2015 | Dupraz | .................. H01H 9/542 |
| | | | | 361/115 |
| 2015/0372474 | A1 * | 12/2015 | Davidson | ............... H01H 9/541 |
| | | | | 361/101 |
| 2016/0006236 | A1 | 1/2016 | Tang et al. | |

FOREIGN PATENT DOCUMENTS

| | | | |
|---|---|---|---|
| CN | 104158171 | A | 11/2014 |
| CN | 104205544 | A | 12/2014 |
| CN | 104900444 | A | 9/2015 |
| CN | 105262068 | A | 1/2016 |
| CN | 105552827 | A | 5/2016 |
| CN | 105655966 | A | 6/2016 |
| CN | 105656019 | A | 6/2016 |
| WO | 2015154537 | A1 | 10/2015 |
| WO | 2016108524 | A1 | 7/2016 |

OTHER PUBLICATIONS

Written Opinion of the International Search Authority in international application No. PCT/CN2017/085281, dated Jul. 21, 2017.
Supplementary European Search Report in the European application No. 17830283.2, dated Jul. 8, 2019.
A Mokhberdoran et al: "A Review on HVDC Circuit Breakers", 3rd Renewable Power Generation Conference (RPG 2014), Jan. 1, 2014 (Jan. 1, 2014), p. 5.1.2, XP055520827, DOI: 10.1049/cp.2014.0859 ISBN: 978-1-84919-917-9 * figures 2,3,5 *.
An Assembled HVDC Breaker for HVDC Grid, published in Jan. 2016, Power System Technology.

* cited by examiner

COMBINED DIRECT CURRENT CIRCUIT BREAKER AND APPLICATION METHOD THEREOF

TECHNICAL FIELD

The invention relates to the technical field of power electronics, and particularly to a novel combined direct current circuit breaker and an application method thereof.

BACKGROUND

A flexible direct current power transmission technology provides an effective solution for large-scale grid connection and consumption of renewable energy, and is widely demanded and has broad application market throughout the world. However, due to lack of a direct current circuit breaker applicable to a high-voltage direct current system, development and construction of a flexible direct current power grid is greatly limited.

Present high-voltage direct current circuit breakers mainly include hybrid direct current circuit breakers, which combine advantages of low running loss of mechanical direct current circuit breakers and quick breaking of solid-state direct current circuit breakers. For example, a hybrid direct current circuit breaker researched and developed by the ABB has high high-voltage technical performance, its rated voltage reaches 200 kV, a breaking time does not exceed 3 ms, and a breaking current reaches 15 kA. However, such a hybrid direct current circuit breaker includes a large number of high-power fully-controlled power electronic devices, and factors of low single-tube withstand voltage, high cost and the like of the high-power fully-controlled power electronic devices make the hybrid direct current circuit breaker expensive.

High-voltage direct current circuit breakers are required to be arranged on both sides of each direct current power transmission line of a flexible direct current power grid to implement quick isolation of a failure line. Therefore, along with continuous enlargement of a transmission scale of the flexible direct current power grid, a number of applied high-voltage direct current circuit breakers is also multiplied, which further increases investment cost of the flexible direct current power grid and is favorable for its development and construction.

SUMMARY

In order to improve application economy of a high-voltage direct current circuit breaker in a flexible direct current power grid, the invention provides a novel combined direct current circuit breaker and an application method thereof.

On a first aspect, the technical solution of a novel combined direct current circuit breaker in the invention is as follows.

The combined direct current circuit breaker includes a transfer branch, an energy absorption branch, at least two primary branches and at least two secondary branches;

the transfer branch is connected in parallel with the energy absorption branch;

the primary branches are in one-to-one correspondence with the second branches; the primary branches are connected with direct current outgoing lines of a direct current busbar in a high-voltage direct current power transmission system; and the secondary branches are connected in series with the transfer branches and then connected in parallel with two ends of the primary branches corresponding to the secondary branches.

A preferred technical solution further provided by the invention is that:

each primary branch includes at least one quick mechanical switch and at least one power electronic switch connected in series, and is arranged to conduct a load current when the high-voltage direct current power transmission system normally runs;

each secondary branch includes at least one quick mechanical switch and at least one power electronic switch connected in series, and is arranged to isolate a current and voltage between the direct current outgoing lines;

the transfer branch includes multiple power electronic switches connected in series, and is arranged to break a failure current when the direct current outgoing line or direct current busbar or direct current converter station connected with any primary branch fails; and the energy absorption branch includes a nonlinear resistor or a lightening arrester, and is arranged to break an overvoltage and absorb energy stored by an inductive device in the high-voltage direct current power transmission system when the direct current outgoing line or direct current busbar or direct current converter station connected with any primary branch fails.

A preferred technical solution further provided by the invention is that:

the mechanical switches include serial multi-break mechanical switches or multi-branch parallel mechanical switches; the serial multi-break mechanical switches include multiple switches connected in series, and the multi-branch parallel mechanical switches include multiple switches connected in parallel; and the power electronic switches are bidirectional on/off switches.

A preferred technical solution further provided by the invention is that:

the power electronic switches include fully-controlled device reverse-series switches, fully-controlled device reverse-parallel switches, first full-bridge switches, second full-bridge switches and diode bridge type switches;

each fully-controlled device reverse-series switch includes two fully-controlled power electronic devices reversely connected in series, and each of the fully-controlled power electronic devices is reversely connected in parallel with a diode;

each fully-controlled reverse-parallel switch includes two fully-controlled power electronic devices reversely connected in parallel;

each first full-bridge switch includes a full-bridge structure unit, its bridge arm includes a fully-controlled power electronic device, and its capacitor is connected in parallel with a first resistor;

each second full-bridge switch includes a full-bridge structure unit, its bridge arm includes a fully-controlled power electronic device, and its direct current capacitor is connected in series with the diode after being connected in parallel with a second resistor; and each diode bridge type switch includes a full-bridge structure unit, its bridge arm includes a diode, and its direct current capacitor is connected in parallel with the fully-controlled power electronic device.

On a second aspect, a technical solution of an application method of the novel combined direct current circuit breaker is as follows.

The method includes that a working mode of the direct current circuit breaker is switched according to a running state of a high-voltage direct current power transmission system:

when the high-voltage direct current power transmission system runs normally, the direct current circuit breaker is switched into a first working mode;

when the high-voltage direct current power transmission system has a line failure, the direct current circuit breaker is switched into a second working mode; and when the high-voltage direct current power transmission system has a converter station outlet failure, the direct current circuit breaker is switched into a third working mode.

A preferred technical solution further provided by the invention is that:

the operation that the direct current circuit breaker is switched into the first working mode includes that:

quick mechanical switches of all primary branches are closed and power electronic switches of all the primary branches are triggered to be turned on;

quick mechanical switches of all secondary branches are closed and power electronic switches of all the secondary branches are latched; and power electronic switches of a transfer branch are latched.

A preferred technical solution further provided by the invention is that: an initial state of the direct current circuit breaker is that: the quick mechanical switches in all the primary branches are closed, the power electronic switches are turned on, the quick mechanical switches in all the secondary branches are closed, the power electronic switches are latched, and the power electronic switches in the transfer branch are latched;

the operation that the direct current circuit breaker is switched into the second working mode includes that:

in Step 11, the power electronic switch of the primary branch connected with a failure line is latched, the power electronic switch of the secondary branch corresponding to the primary branch is triggered to be turned on, and the power electronic switches of the transfer branch are triggered to be turned on;

in Step 12, after a current flows through the primary branch connected with the failure line in Step 11 crosses zero, the quick mechanical switch of the primary branch is broken, and the quick mechanical switch of the secondary branch not corresponding to the primary branch is broken; and in Step 13, after breaking opening ranges of the quick mechanical switches of the primary branch and the secondary branch in Step 12 withstand a transient breaking voltage, the power electronic switches of the transfer branch are latched, a failure current of the failure line is transferred to an energy absorption circuit, and when the failure current in the energy absorption circuit crosses zero, the high-voltage direct current power transmission system is recovered to run normally.

A preferred technical solution further provided by the invention is that: after the high-voltage direct current power transmission system is recovered to run normally in Step 13, the method includes that:

the direct current circuit breaker is controlled to isolate the failure line, including that: the quick mechanical switch of the secondary branch corresponding to the primary branch connected with the failure line is broken, the quick mechanical switches of the other secondary branches are closed, and the direct current circuit breaker is recovered into the initial state;

or, the direct current circuit breaker is controlled to be quickly re-switched on, including that:

the power electronic switches of the transfer branch are triggered to be turned on according to a re-switching-on instruction, and if the failure of the failure line still exists, the power electronic switches are latched and the failure line is isolated;

the power electronic switches of the transfer branch are triggered to be turned on according to the re-switching-on instruction, and if the failure of the failure line is eliminated, the quick mechanical switch of the primary branch connected with the failure line is closed, its power electronic switch is triggered to be turned on, and the quick mechanical switches of the secondary branches not corresponding to the primary branch are closed; and after a current flowing through the transfer branch crosses zero, the power electronic switches of the transfer branch and the secondary branch corresponding to the primary branch are latched, and the direct current circuit breaker is recovered into the initial state.

A preferred technical solution further provided by the invention is that: the initial state of the direct current circuit breaker is that: the quick mechanical switches in all the primary branches are closed, the power electronic switches are turned on, the quick mechanical switches in all the secondary branches are closed, the power electronic switches are latched, and the power electronic switches in the transfer branch are latched;

the operation that the direct current circuit breaker is switched into the third working mode includes that:

in Step 21, the power electronic switches of all the primary branches are latched, and the power electronic switches of the transfer branch and all the secondary branches are triggered to be turned on;

in Step 22, after a failure current of an outlet of a converter station is totally transferred to the transfer branch and the secondary branches, the quick mechanical switches of all the primary branches are broken; and in Step 23, after breaking opening ranges of the quick mechanical switches withstand the transient breaking voltage, the power electronic switches of the transfer branch are latched, the failure current is transferred to the energy absorption circuit, and after the failure current in the energy absorption circuit crosses zero, a load current of the high-voltage direct current power transmission system is conducted through the secondary branches.

Compared with the closest conventional art, the invention has the following beneficial effects.

1: The novel combined direct current circuit breaker provided by the invention includes multiple primary branches and multiple secondary branches, is applied to a direct current system of which a direct current busbar of a converter station has two or more outgoing lines, and may quickly isolate failures of lines, busbar, converter station and the like of the direct current system to ensure safe, reliable and economical running of the direct current system.

2: The novel combined direct current circuit breaker provided by the invention has the characteristics of low loss, quickness, bidirectionality, strong circuit breaking, high extensibility and the like, may implement quick re-switching-on and meets different running requirements of a direct current power grid.

3: According to the novel combined direct current circuit breaker provided by the invention, the multiple primary branches share the same transfer branch and the same energy absorption branch, and flexible, simple and low-cost extension may be implemented along with increase of direct current lines.

4: According to the novel combined direct current circuit breaker provided by the invention, after the outlet of the converter station fails and is isolated, the direct current system may still be kept running, and no direct current circuit breaker is required to be mounted at the outlet of the converter station, so that a number of direct current circuit breakers used for the direct current power grid may be reduced.

5: Compared with an independent hybrid direct current circuit breaker arranged on two sides of a direct current line, the novel combined direct current circuit breaker provided by the invention greatly reduces equipment investment of a branch circuit breaker in a high-voltage high-capacity direct current power grid, and is favorable for construction of the direct current power grid and popularization and application of a hybrid direct current circuit breaker.

6: The novel combined direct current circuit breaker provided by the invention may greatly reduce the whole size of the direct current circuit breaker in the direct current power grid, is favorable for overall arrangement and design of the converter station and facilitates practical project implementation.

DETAILED DESCRIPTION

In order to make the purpose, technical solutions and advantages of embodiments of the invention clearer, the technical solutions in the embodiments of the invention will be clearly and completely described below in combination with the drawings in the embodiments of the invention. Obviously, the described embodiments are not all embodiments but part of embodiments of the invention. All other embodiments obtained by those skilled in the art on the basis of the embodiments of the invention without creative work fall within the scope of protection of the invention.

A novel combined direct current circuit breaker provided by the embodiments of the invention will be described below in combination with the drawings respectively.

Figure 1:
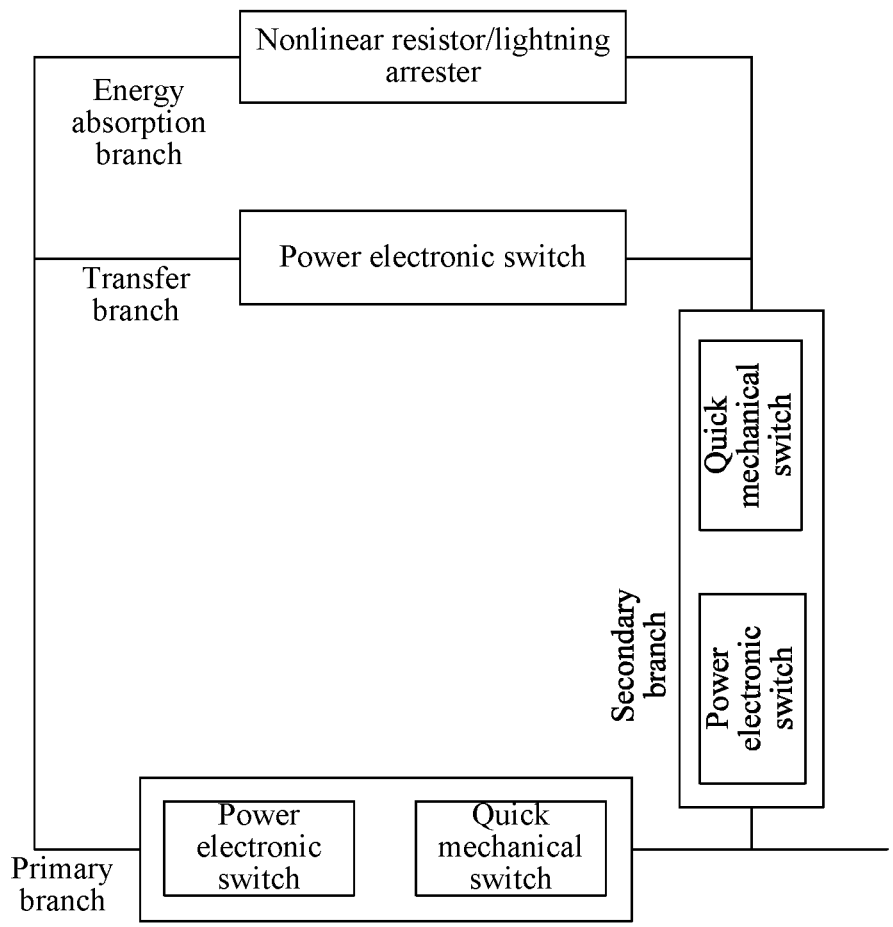
FIG. 1 is a schematic diagram of each branch of a novel combined direct current circuit breaker according to an embodiment of the invention.

FIG. 1 is a schematic diagram of each branch of a novel combined direct current circuit breaker according to an embodiment of the invention, i.e. a schematic diagram of basic branches forming the novel combined direct current circuit breaker. As shown in the figure, the basic branches forming the novel combined direct current circuit breaker in the embodiment include primary branches, secondary branches, a transfer branch and an energy absorption branch, herein the primary branches are arranged to conduct a load current when a high-voltage direct current power transmission system normally runs;

the secondary branches are arranged to isolate a current and voltage between each direct current outgoing line;

the transfer branch is arranged to break a failure current when a direct current outgoing line or direct current busbar or direct current converter station connected with any primary branch fails; and the energy absorption branch is arranged to break an overvoltage and absorb energy stored by an inductive device in the high-voltage direct current power transmission system when the direct current outgoing line or direct current busbar or direct current converter station connected with any primary branch fails.

Figure 2:
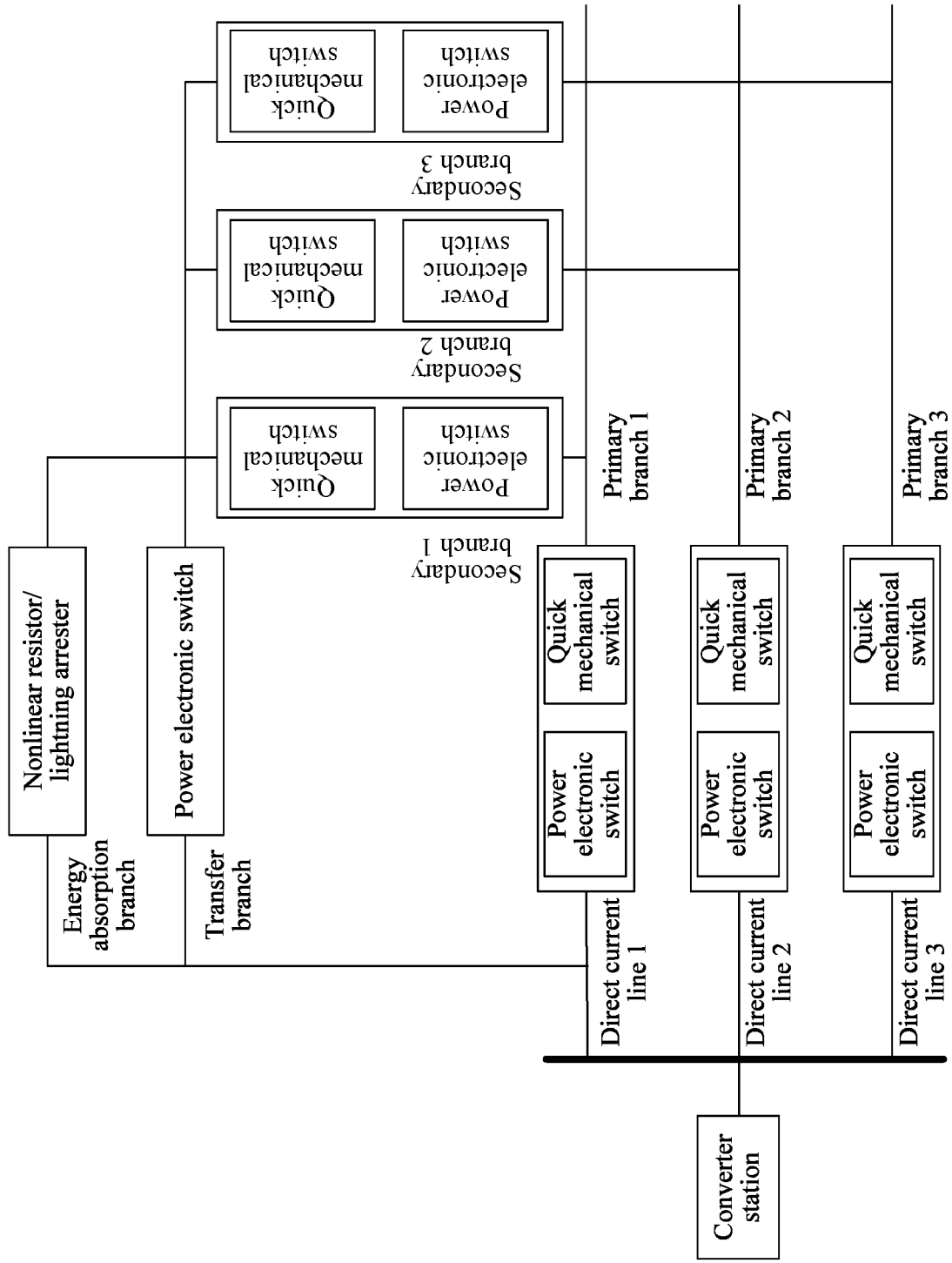
FIG. 2 is a topological diagram of a novel combined direct current circuit breaker according to an embodiment of the invention.

FIG. 2 is a topological diagram of a novel combined direct current circuit breaker according to an embodiment of the invention. As shown in the figure, the novel combined direct current circuit breaker in the embodiment includes a transfer branch, an energy absorption branch, at least two primary branches and at least two secondary branches; the transfer branch is connected in parallel with the energy absorption branch; the primary branches are in one-to-one correspondence with the second branches; the primary branches are connected with direct current outgoing lines of a direct current busbar in a high-voltage direct current power transmission system; and the secondary branches are connected in series with the transfer branches and then connected in parallel with two ends of the primary branches corresponding to the secondary branches, herein each primary branch includes at least one quick mechanical switch and at least one power electronic switch connected in series;

each secondary branch includes at least one quick mechanical switch and at least one power electronic switch connected in series;

the transfer branch includes multiple power electronic switches connected in series; and the energy absorption branch includes a nonlinear resistor or a lightening arrester.

In the embodiment, the quick mechanical switches may be serial multi-break mechanical switches, and may also be multi-branch parallel mechanical switches, herein the serial multi-break mechanical switches include multiple switches connected in series, and the multi-branch parallel mechanical switches include multiple switches connected in parallel.

Figure 3:
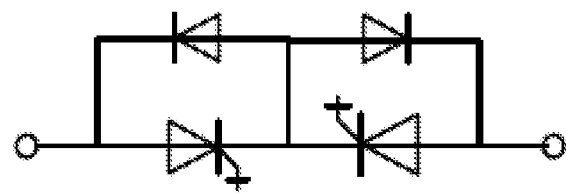
FIG. 3 is a topological diagram of a fully-controlled device reverse-series switch according to an embodiment of the invention.

In the embodiment, the power electronic switches may be fully-controlled device reverse-series switches, fully-controlled device reverse-parallel switches, first full-bridge switches, second full-bridge switches and diode bridge type switches, herein FIG. 3 is a topological diagram of a fully-controlled device reverse-series switch according to an embodiment of the invention, and as shown in the figure, each fully-controlled device reverse-series switch in the embodiment includes two fully-controlled power electronic devices reversely connected in series, and each of the fully-controlled power electronic devices is reversely connected in parallel with a diode.

Figure 4:
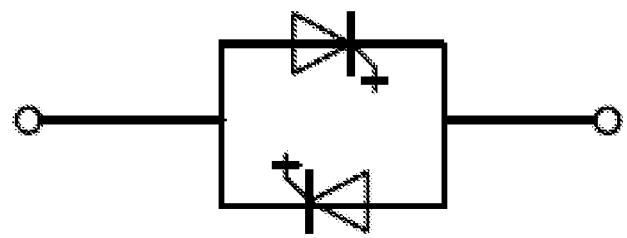
FIG. 4 is a topological diagram of a fully-controlled device reverse-parallel switch according to an embodiment of the invention.

FIG. 4 is a topological diagram of a fully-controlled device reverse-parallel switch according to an embodiment of the invention, and as shown in the figure, the fully-controlled reverse-parallel switch in the embodiment includes two fully-controlled power electronic devices reversely connected in parallel.

Figure 5:
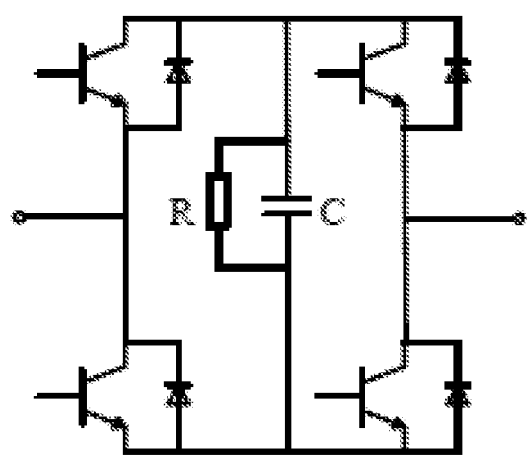
FIG. 5 is a topological diagram of a first full-bridge switch according to an embodiment of the invention.

FIG. 5 is a topological diagram of a first full-bridge switch according to an embodiment of the invention, and as shown in the figure, the first full-bridge switch in the embodiment includes a full-bridge structure unit, its bridge arm includes a fully-controlled power electronic device, and its capacitor is connected in parallel with a first resistor.

Figure 6:
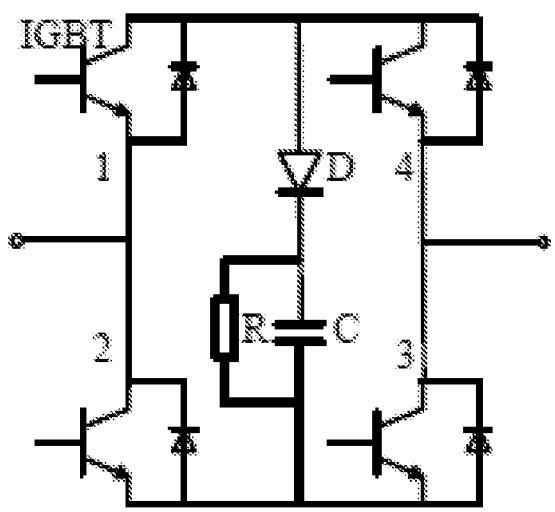
FIG. 6 is a topological diagram of a second full-bridge switch according to an embodiment of the invention.

FIG. 6 is a topological diagram of a second full-bridge switch according to an embodiment of the invention, and as shown in the figure, the second full-bridge switch in the embodiment includes a full-bridge structure unit, its bridge arm includes a fully-controlled power electronic device, and its direct current capacitor is connected in series with the diode after being connected in parallel with a second resistor.

Figure 7:
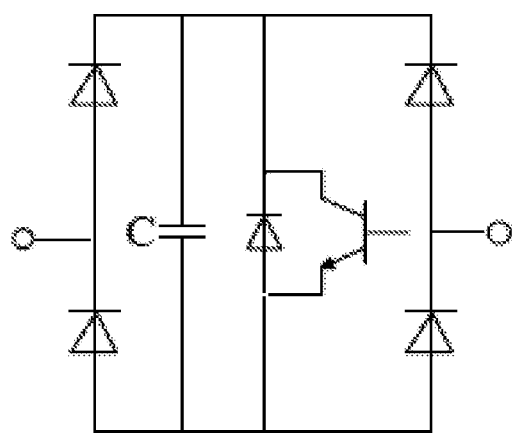
FIG. 7 is a topological diagram of a diode bridge type switch according to an embodiment of the invention.

FIG. 7 is a topological diagram of a diode bridge type switch according to an embodiment of the invention, and as shown in the figure, the diode bridge type switch in the embodiment includes a full-bridge structure unit, its bridge arm includes a diode, and its direct current capacitor is connected in parallel with the fully-controlled power electronic device.

Figure 8:
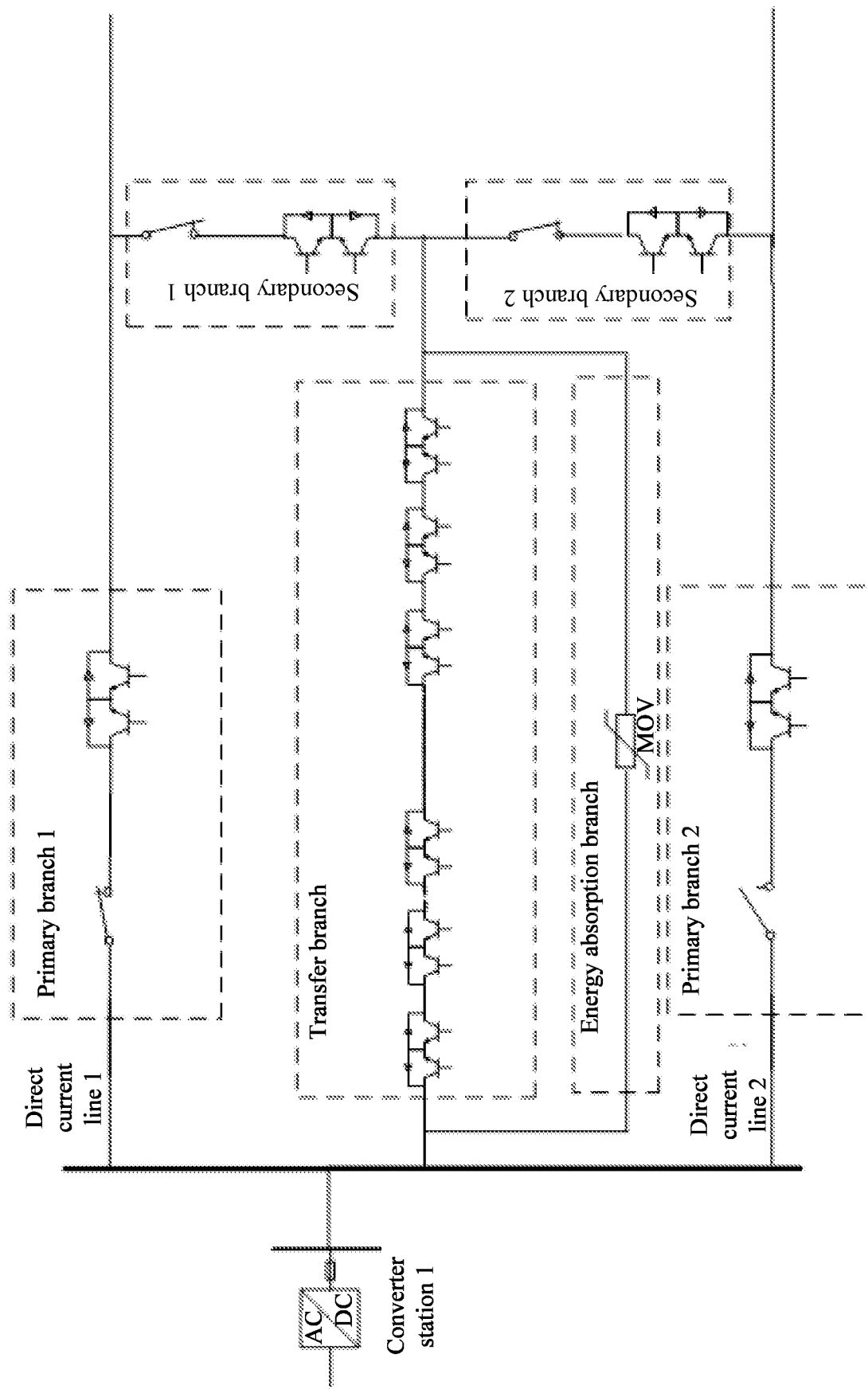
FIG. 8 is a schematic diagram of an implementation solution of a novel combined direct current circuit breaker according to an embodiment of the invention.

Based on the different structures of power electronic switches, the invention provides two implementation solutions of the novel combined direct current circuit breaker, herein FIG. 8 is a schematic diagram of an implementation solution of a novel combined direct current circuit breaker according to an embodiment of the invention, and as shown in the figure, in the embodiment, the power electronic switches in the primary branches, the secondary branches and the transfer branch all adopt fully-controlled device reverse-series switches.

Figure 9:
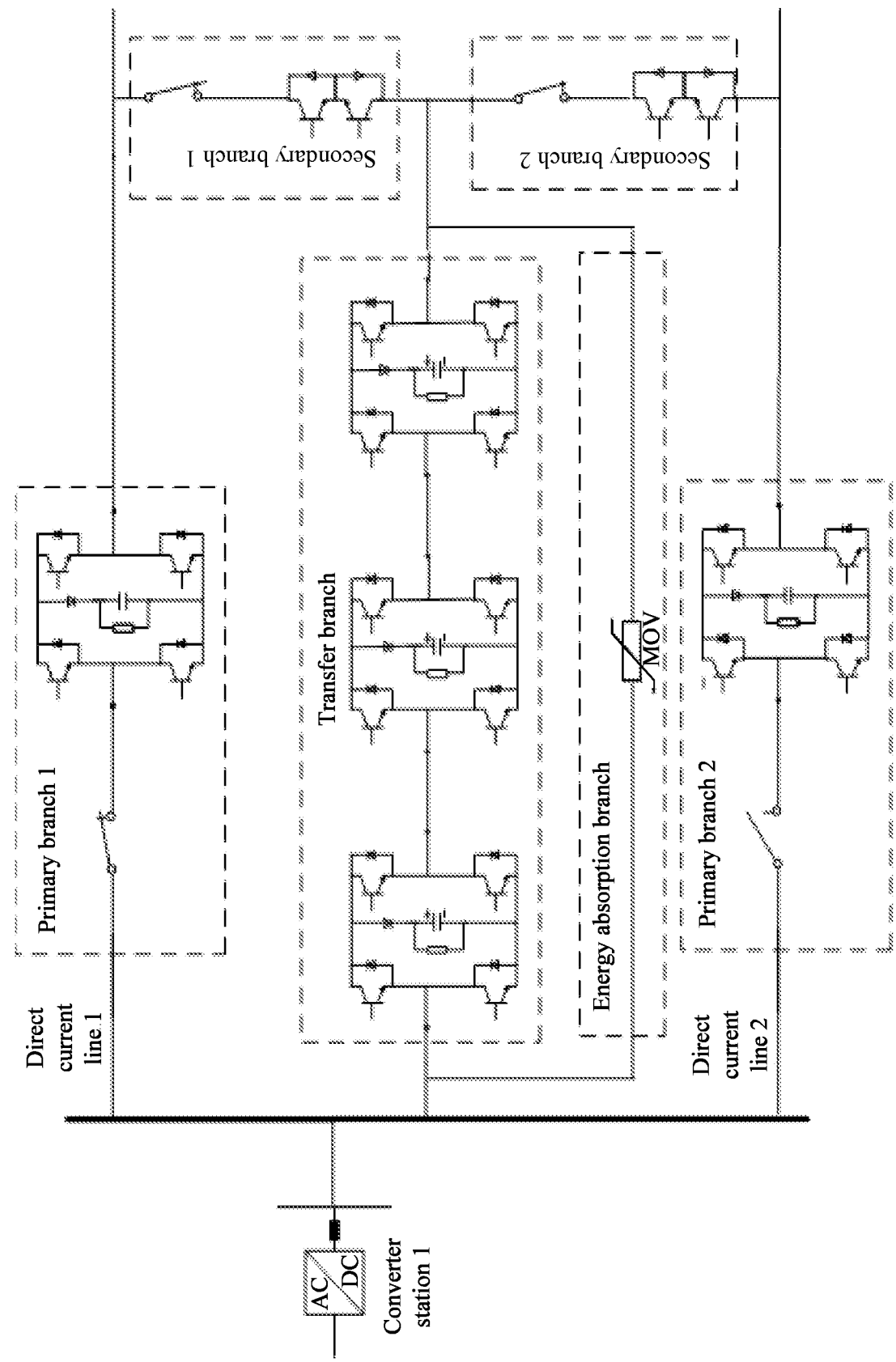
FIG. 9 is a schematic diagram of another implementation solution of a novel combined direct current circuit breaker according to an embodiment of the invention.

FIG. 9 is a schematic diagram of another implementation solution of a novel combined direct current circuit breaker according to an embodiment of the invention, and as shown in the figure, in the embodiment, the power electronic switches in the primary branch and the transfer branch all adopt second full-bridge switches, and the power electronic switches in the secondary branches adopt fully-controlled device reverse-series switches.

An application method of a novel combined direct current circuit breaker provided by the embodiment of the invention will be described below in combination with the drawings respectively. The application method of the novel combined direct current circuit breaker in the invention is that: a working mode of the direct current circuit breaker is switched according to a running state of a high-voltage direct current power transmission system:

when the high-voltage direct current power transmission system runs normally, the direct current circuit breaker is switched into a first working mode; when the high-voltage direct current power transmission system has a line failure, the direct current circuit breaker is switched into a second working mode; and when the high-voltage direct current power transmission system has a converter station outlet failure, the direct current circuit breaker is switched into a third working mode.

(1) The direct current circuit breaker is switched into the first working mode.

An operation method of the direct current circuit breaker in the embodiment is as follows:

quick mechanical switches of all primary branches are closed and power electronic switches of all the primary branches are triggered to be turned on;

quick mechanical switches of all secondary branches are closed and power electronic switches of all the secondary branches are latched; and power electronic switches of a transfer branch are latched.

(2) The direct current circuit breaker is switched into the second working mode.

An initial state of the direct current circuit breaker is that: the quick mechanical switches in all the primary branches are closed, the power electronic switches are turned on, the quick mechanical switches in all the secondary branches are closed, the power electronic switches are latched, and the power electronic switches in the transfer branch are latched; the direct current circuit breaker is switched into the second working mode by the following method:

in Step 11, the power electronic switch of the primary branch connected with a failure line is latched, the power electronic switch of the secondary branch corresponding to the primary branch is triggered to be turned on, and the power electronic switches of the transfer branch are triggered to be turned on;

in Step 12, after a current flows through the primary branch connected with the failure line in Step 11 crosses zero, the quick mechanical switch of the primary branch is broken, and the quick mechanical switch of the secondary branch not corresponding to the primary branch is broken; and in Step 13, after breaking opening ranges of the quick mechanical switches of the primary branch and the secondary branch in Step 12 withstand a transient breaking voltage, the power electronic switches of the transfer branch are latched, a failure current of the failure line is transferred to an energy absorption circuit, and when the failure current in the energy absorption circuit crosses zero, the high-voltage direct current power transmission system is recovered to run normally.

After the high-voltage direct current power transmission system is recovered to run normally in the embodiment, the method includes that:

the direct current circuit breaker is controlled to isolate the failure line, including that: the quick mechanical switch of the secondary branch corresponding to the primary branch connected with the failure line is broken, the quick mechanical switches of the other secondary branches are closed, and the direct current circuit breaker is recovered into the initial state;

or, the direct current circuit breaker is controlled to be quickly re-switched on, including that:

the power electronic switches of the transfer branch are triggered to be turned on according to a re-switching-on instruction, and if the failure of the failure line still exists, the power electronic switches are latched and the failure line is isolated;

the power electronic switches of the transfer branch are triggered to be turned on according to the re-switching-on instruction, and if the failure of the failure line is eliminated, the quick mechanical switch of the primary branch connected with the failure line is closed, its power electronic switch is triggered to be turned on, and the quick mechanical switches of the secondary branches not corresponding to the primary branch are closed; and after a current flowing through the transfer branch crosses zero, the power electronic switches of the transfer branch and the secondary branch corresponding to the primary branch are latched, and the direct current circuit breaker is recovered into the initial state.

(3) The direct current circuit breaker is switched into the third working mode.

The initial state of the direct current circuit breaker is that: the quick mechanical switches in all the primary branches are closed, the power electronic switches are turned on, the quick mechanical switches in all the secondary branches are closed, the power electronic switches are latched, and the power electronic switches in the transfer branch are latched; the direct current circuit breaker is switched into the third working mode by the following method:

in Step 21, the power electronic switches of all the primary branches are latched, and the power electronic switches of the transfer branch and all the secondary branches are triggered to be turned on;

in Step 22, after a failure current of an outlet of a converter station is totally transferred to the transfer branch and the secondary branches, the quick mechanical switches of all the primary branches are broken; and in Step 23, after breaking opening ranges of the quick mechanical switches withstand the transient breaking voltage, the power electronic switches of the transfer branch are latched, the failure current is transferred to the energy absorption circuit, and after the failure current in the energy absorption circuit crosses zero, a load current of the high-voltage direct current power transmission system is conducted through the secondary branches.

The application method of the novel combined direct current circuit breaker will be described with the schematic diagram, shown in FIG. 9, of the implementation solution of the novel combined direct current circuit breaker as an example. In the embodiment, the novel combined direct current circuit breaker includes a transfer branch, an energy absorption branch, two primary branches (a primary branch 1 and a primary branch 2) and two secondary branches (a secondary branch 1 and a secondary branch 2), the primary branch 1 is connected with a direct current line 1, and the primary branch 2 is connected with a direct current line 2.

(1) The direct current circuit breaker is switched into a first working mode.

Figure 10:
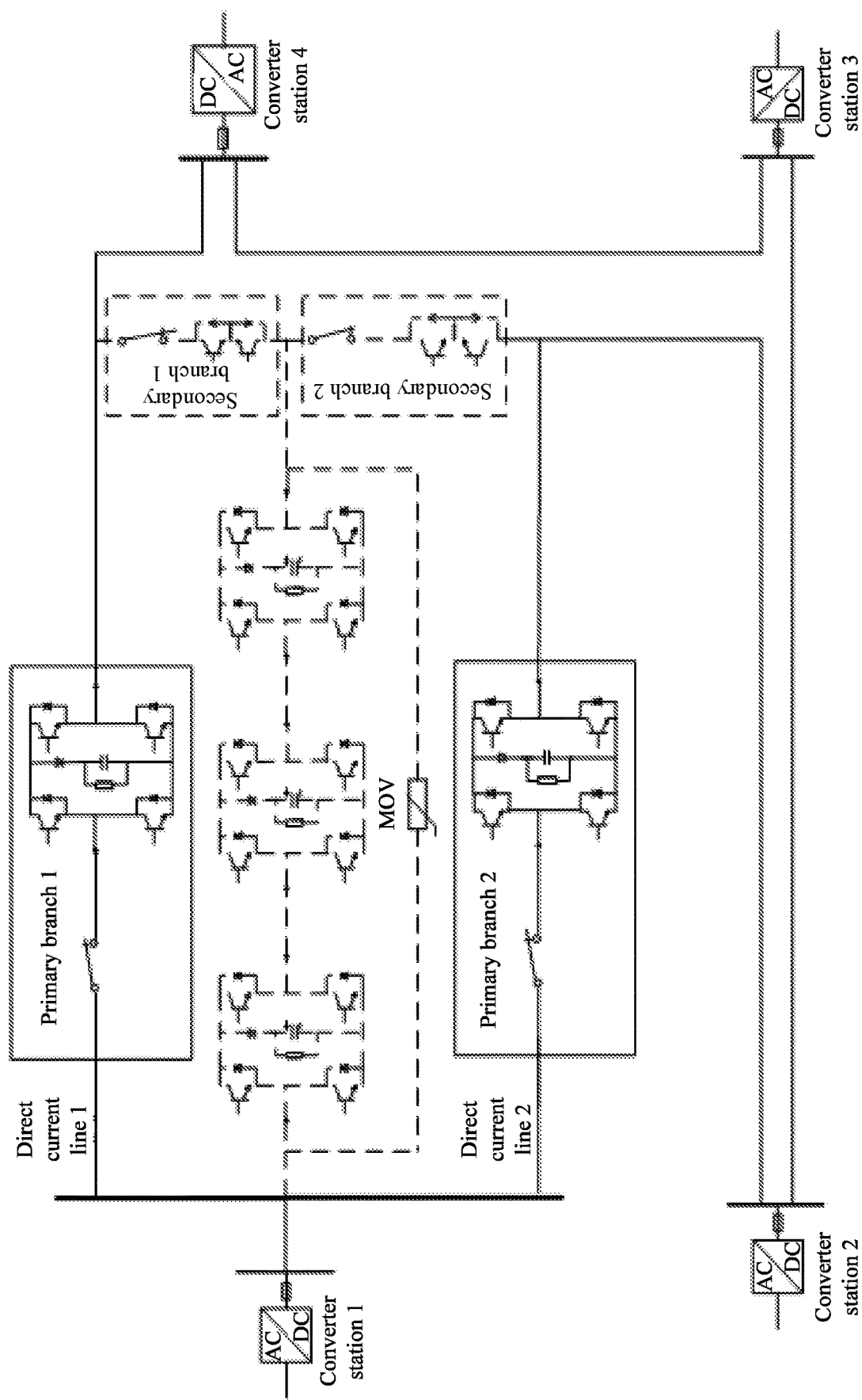
FIG. 10 is a state diagram when a direct current circuit breaker is in a first working mode according to an embodiment of the invention.

FIG. 10 is a state diagram when a direct current circuit breaker is in a first working mode according to an embodiment of the invention. As shown in the figure, in the embodiment, quick mechanical switches of the primary branch 1 and the primary branch 2 are closed, and power electronic switches are triggered to be turned on, and direct current power is transmitted to another converter station through the primary branch 1 and the primary branch 2. Quick mechanical switches of the secondary branch 1 and the secondary branch 2 are closed, power electronic switches are latched, and a load current may not circulate through the secondary branches. Power electronic switches of the transfer branch are latched.

(2) The direct current circuit breaker is switched into a second working mode.

Figure 11:
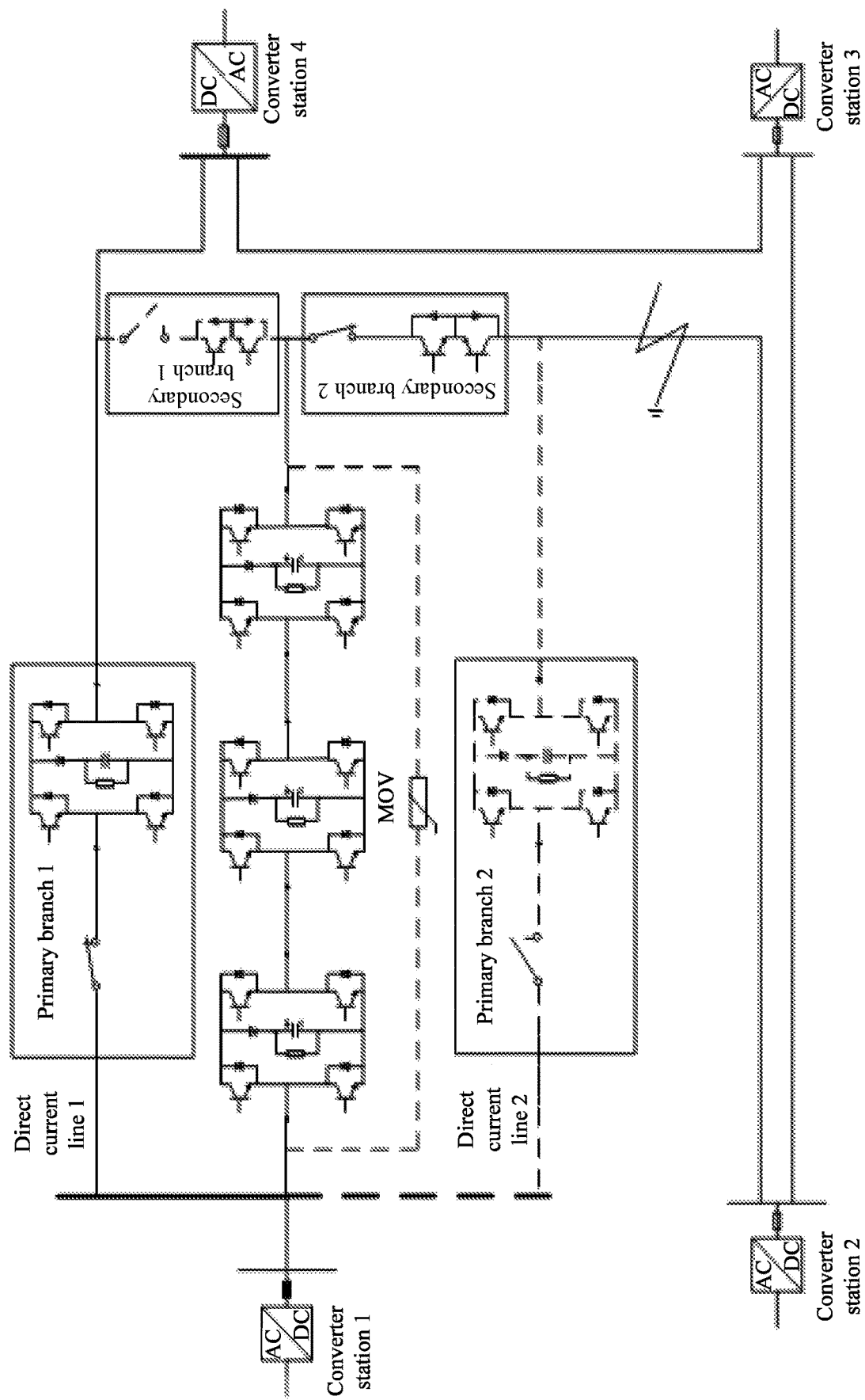
FIG. 11 is a first state diagram when a direct current circuit breaker is in a second working mode according to an embodiment of the invention.

An initial state of the direct current circuit breaker is that: the quick mechanical switches in the primary branch 1 and the primary branch 2 are closed, the power electronic switches are turned on, the quick mechanical switches in the secondary branch 1 and the secondary branch 2 are closed, the power electronic switches are latched, and the power electronic switches in the transfer branch are latched; and if the direct current line 2 has a grounding failure:

FIG. 11 is a first state diagram when a direct current circuit breaker is in a second working mode according to an embodiment of the invention, and as shown in the figure, in the embodiment, the power electronic switch in the primary branch 2 is latched, the power electronic switch of the secondary branch 2 is triggered to be turned on, and the power electronic switches of the transfer branch are triggered to be turned on. After a current flowing through the primary branch 2 crosses zero, the quick mechanical switch of the primary branch 2 is broken, and the quick mechanical switch of the secondary branch 1 is broken.

Figure 12:
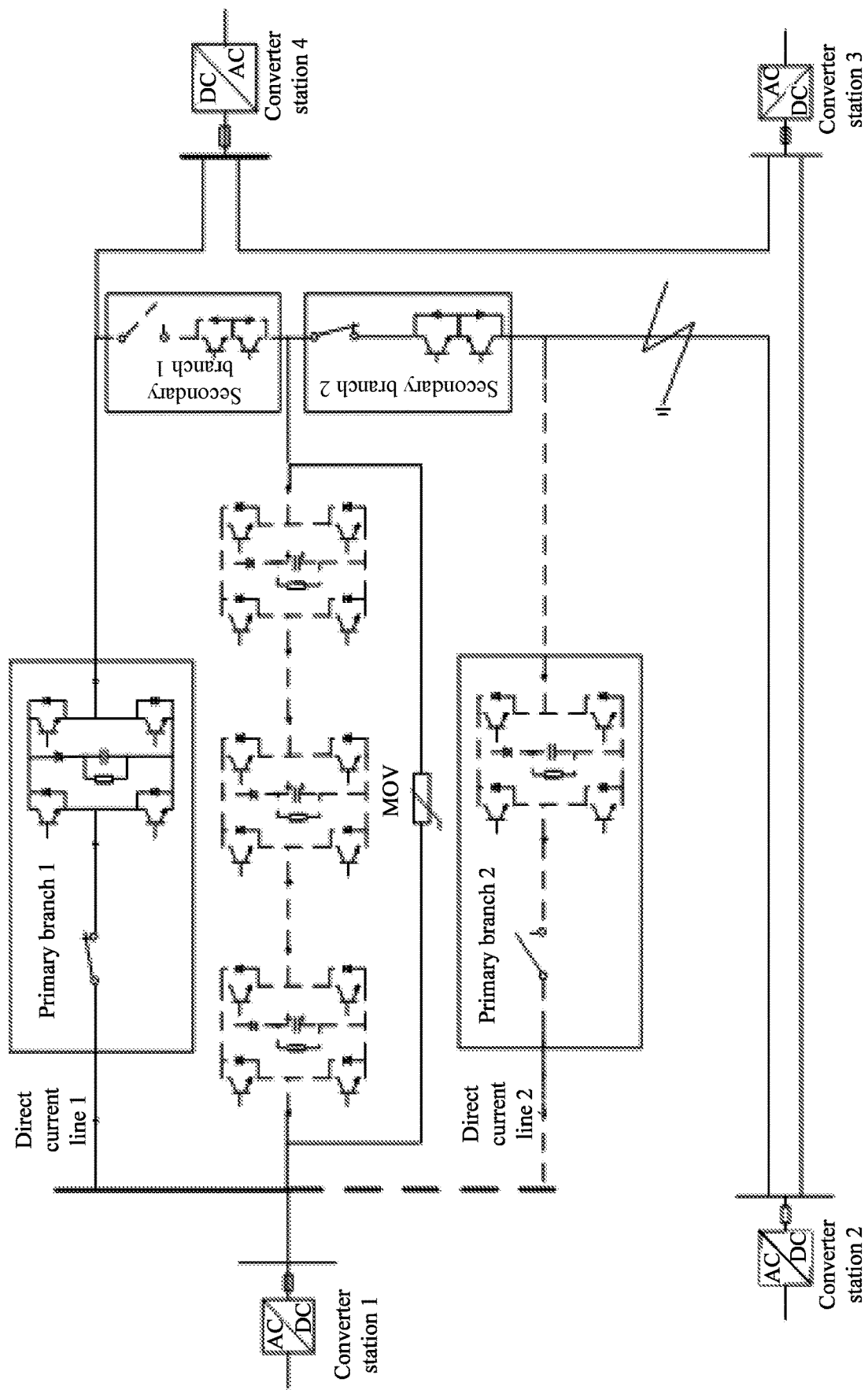
FIG. 12 is a second state diagram when a direct current circuit breaker is in a second working mode according to an embodiment of the invention.

FIG. 12 is a second state diagram when a direct current circuit breaker is in a second working mode according to an embodiment of the invention. As shown in the figure, in the embodiment, after breaking opening ranges of the quick mechanical switches of the primary branch 2 and the secondary branch 1 withstand a transient breaking voltage, the power electronic switches of the transfer branch are latched, and a failure current of the failure line is transferred to the energy absorption branch; and after the failure current in the energy absorption branch crosses zero, the high-voltage direct current power transmission system is recovered to run normally.

Figure 13:
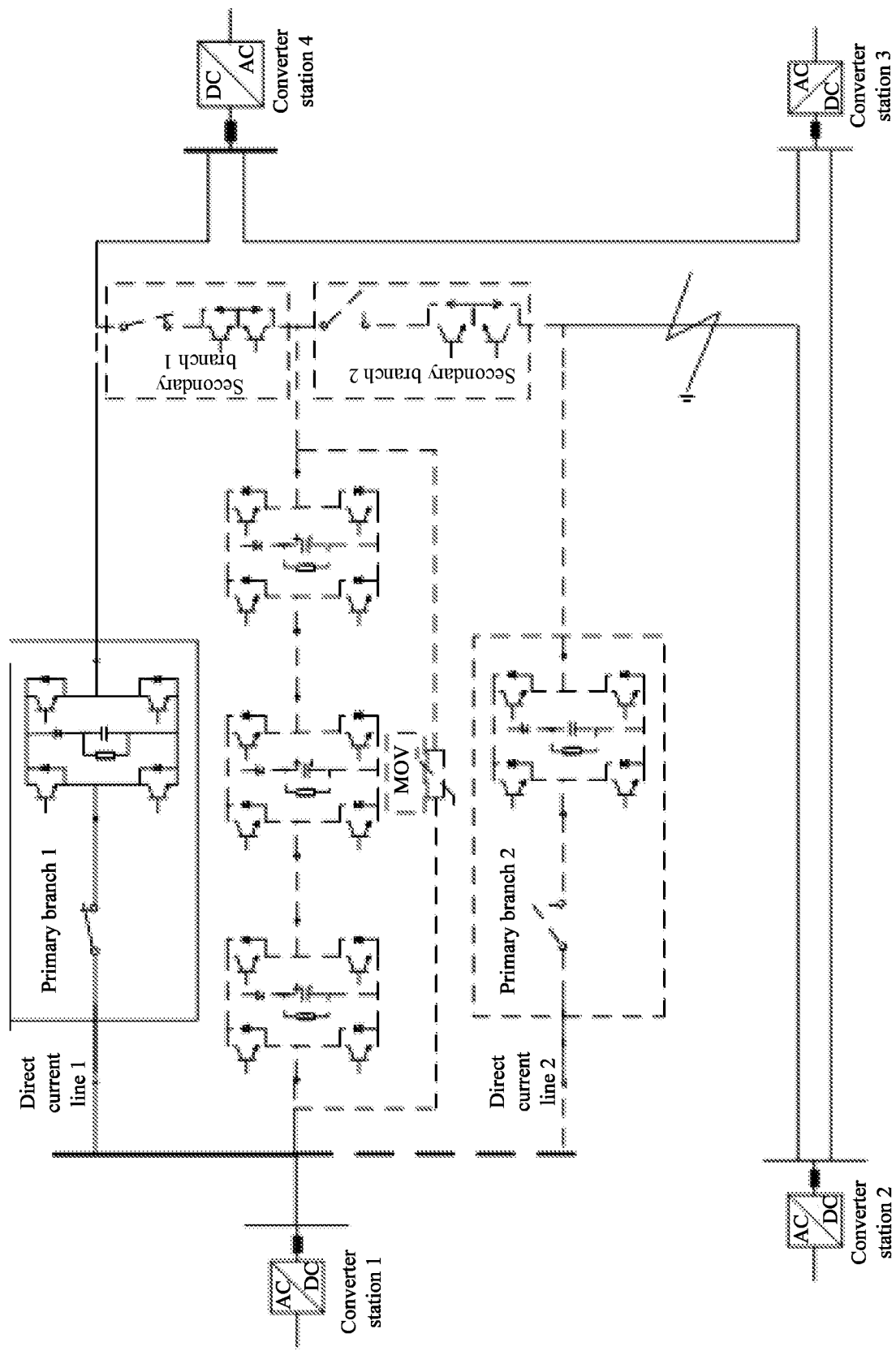
FIG. 13 is a third state diagram when a direct current circuit breaker is in a second working mode according to an embodiment of the invention.

FIG. 13 is a third state diagram when a direct current circuit breaker is in a second working mode according to an embodiment of the invention. As shown in the figure, in the embodiment, after the current of the failure line crosses zero, the quick mechanical switch of the secondary branch 2 is broken, the quick mechanical switch of the secondary branch 1 is closed, and the direct current circuit breaker completes isolation of the failure line and is recovered into the initial state.

Quick re-switching-on of the direct current circuit breaker includes that:

the power electronic switches of the transfer branch are triggered to be turned on according to a re-switching-on instruction, and if the grounding failure of the direct current line 2 still exists, the power electronic switches are latched, and the direct current line 2 is controlled to quit the high-voltage direct current power transmission system;

the power electronic switches of the transfer branch are triggered to be turned on according to the re-switching-on instruction, and if the failure of the direct current line 2 is eliminated, the quick mechanical switch of the primary branch 2 is closed, its power electronic switch is triggered to be turned on, and the quick mechanical switch of the secondary branch 1 is closed; and after a current flowing through the transfer branch crosses zero, the power electronic switches of the transfer branch and the secondary branch 1 are latched, and the direct current circuit breaker is recovered into the initial state.

(3) The direct current circuit breaker is switched into a third working mode.

Figure 14:
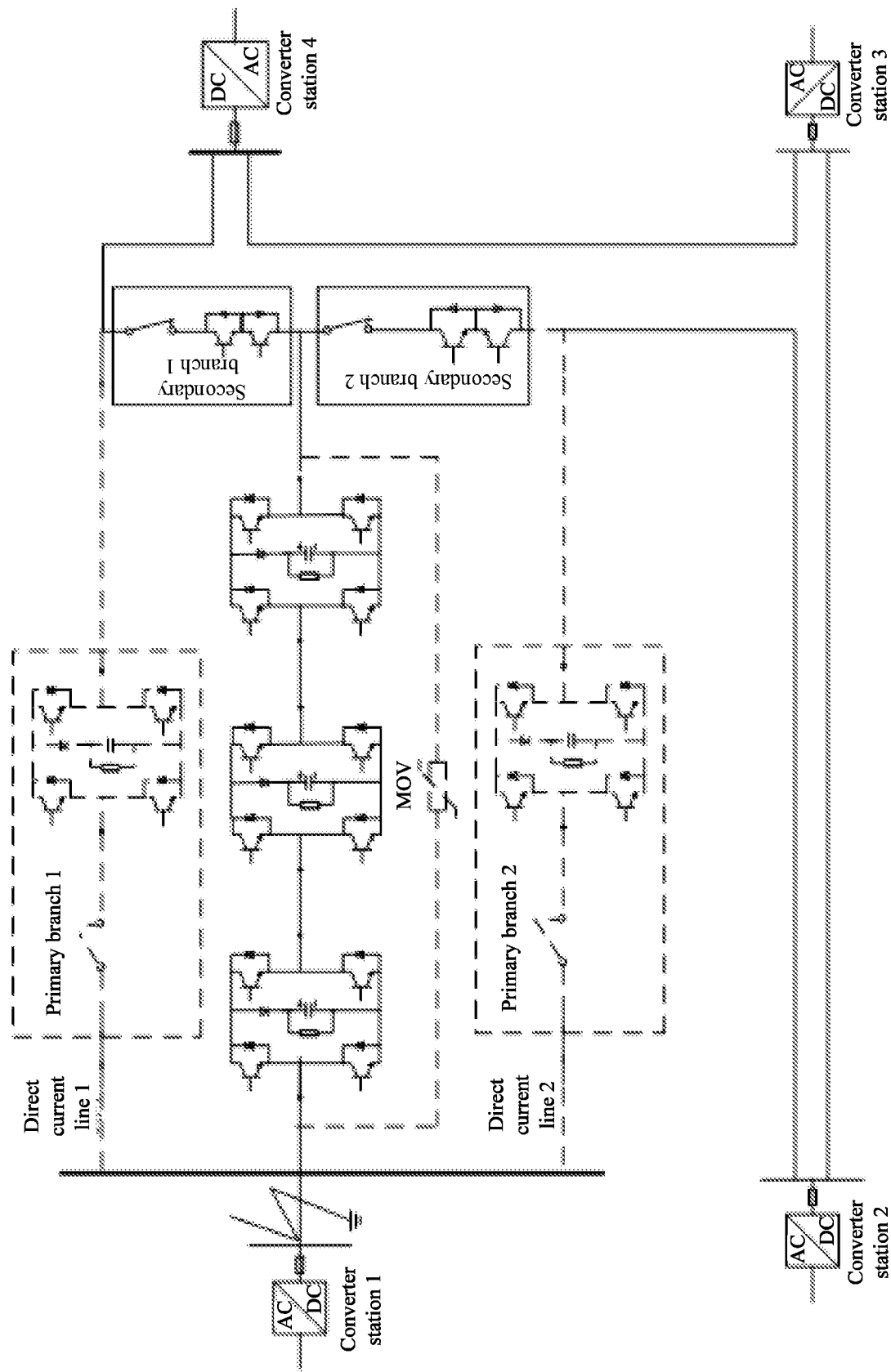
FIG. 14 is a first state diagram when a direct current circuit breaker is in a third working mode according to an embodiment of the invention.

The initial state of the direct current circuit breaker is that: the quick mechanical switches in the primary branch 1 and the primary branch 2 are closed, the power electronic switches are turned on, the quick mechanical switches in the secondary branch 1 and the secondary branch 2 are closed, the power electronic switches are latched, and the power electronic switches in the transfer branch are latched; and if an outlet of the converter station 1 has a grounding failure, FIG. 14 is a first state diagram when a direct current circuit breaker is in a third working mode according to an embodiment of the invention, and as shown in the figure, in the embodiment, the power electronic switches of the primary branch 1 and the primary branch 2 are latched, and the power electronic switches of the transfer branch, the secondary branch 1 and the secondary branch 2 are triggered to be turned on. After the failure current is totally transferred to the transfer branch, the secondary branch 1 and the secondary branch 2, the quick mechanical switches of the primary branch 1 and the primary branch 2 are broken.

Figure 15:
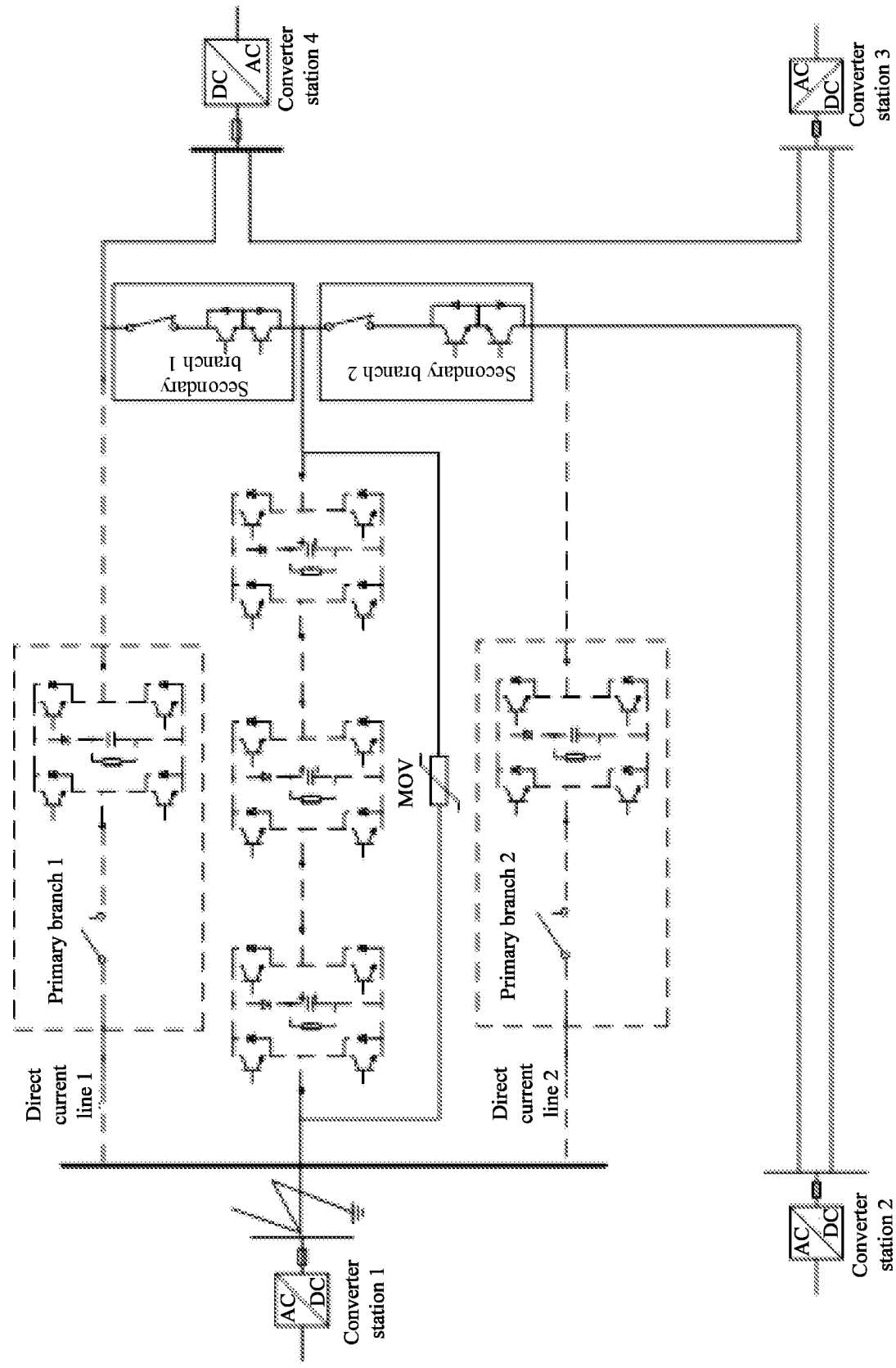
FIG. 15 is a second state diagram when a direct current circuit breaker is in a third working mode according to an embodiment of the invention.

FIG. 15 is a second state diagram when a direct current circuit breaker is in a third working mode according to an embodiment of the invention. As shown in the figure, in the embodiment, after the breaking opening ranges of the quick mechanical switches withstand the transient breaking voltage, the power electronic switches of the transfer branch are latched, and the failure current of the converter station is transferred to the energy absorption branch.

Figure 16:
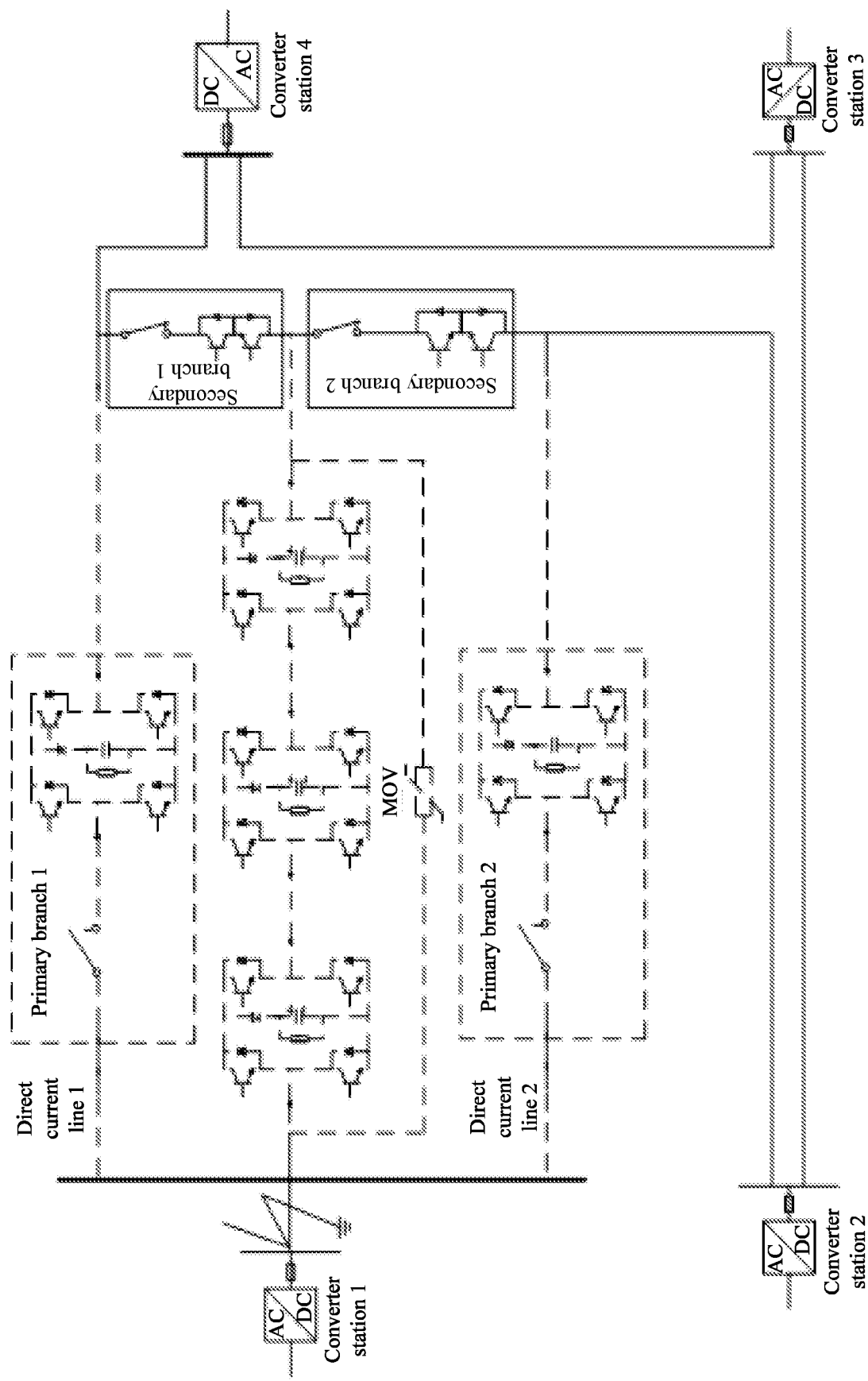
FIG. 16 is a third state diagram when a direct current circuit breaker is in a third working mode according to an embodiment of the invention.

FIG. 16 is a third state diagram when a direct current circuit breaker is in a third working mode according to an embodiment of the invention. As shown in the figure, in the embodiment, after the failure current in the energy absorption branch crosses zero, the load current of the high-voltage direct current power transmission system is conducted through the secondary branch 1 and the secondary branch 2.

Those skilled in the art should know that all or part of the flow of the method of the embodiment may be implemented by instructing related hardware through a computer program, the program may be stored in a computer-readable storage medium, and when the program is executed, the flow of each abovementioned method embodiment may be included, herein the storage medium may be a magnetic disk, an optical disk, a Read-Only Memory (ROM), a Random Access Memory (RAM) or the like.

Obviously, those skilled in the art may make various modifications and transformations to the invention without departing from the spirit and scope of the invention. Therefore, if these modifications and transformations of the invention fall within the scope of the claims of the invention and an equivalent technology thereof, the invention is also intended to include these modifications and transformations.

The invention claimed is:

1. A combined direct current circuit breaker, comprising one transfer branch, one energy absorption branch, at least two primary branches and at least two secondary branches,
    wherein the transfer branch is connected in parallel with the energy absorption branch;
    the primary branches are in one-to-one correspondence with the second branches; the primary branches are connected with direct current outgoing lines of a direct current busbar in a high-voltage direct current power transmission system; and the secondary branches are connected in series with the transfer branch and then connected in parallel with two ends of the primary branches corresponding to the secondary branches,
    wherein the at least two secondary branches have a common connection point with the transfer branch.

2. The combined direct current circuit breaker according to claim 1, wherein
    each primary branch comprises at least one quick mechanical switch and at least one power electronic switch connected in series, and is arranged to conduct a load current when the high-voltage direct current power transmission system normally runs;
    each secondary branch comprises at least one quick mechanical switch and at least one power electronic switch connected in series, and is arranged to isolate a current and voltage between the direct current outgoing lines;
    the transfer branch comprises multiple power electronic switches connected in series, and is arranged to break a failure current when the direct current outgoing line or direct current busbar or direct current converter station connected with any primary branch fails; and
    the energy absorption branch comprises a nonlinear resistor or a lightening arrester, and is arranged to break an overvoltage and absorb energy stored by an inductive device in the high-voltage direct current power transmission system when the direct current outgoing line or direct current busbar or direct current converter station connected with any primary branch fails.

3. The combined direct current circuit breaker according to claim 2, wherein
    the mechanical switches comprise serial multi-break mechanical switches or multi-branch parallel mechanical switches; the serial multi-break mechanical switches comprise multiple switches connected in series, and the multi-branch parallel mechanical switches comprise multiple switches connected in parallel; and
    the power electronic switches are bidirectional on/off switches.

4. The combined direct current circuit breaker according to claim 2, wherein
    the power electronic switches comprise fully-controlled device reverse-series switches, fully-controlled device reverse-parallel switches, first full-bridge switches, second full-bridge switches and diode bridge type switches;
    each fully-controlled device reverse-series switch comprises two fully-controlled power electronic devices reversely connected in series, and each of the fully-controlled power electronic devices is reversely connected in parallel with a diode;
    each fully-controlled reverse-parallel switch comprises two fully-controlled power electronic devices reversely connected in parallel;
    each first full-bridge switch comprises a full-bridge structure unit, its bridge arm comprises a fully-controlled power electronic device, and its capacitor is connected in parallel with a first resistor;
    each second full-bridge switch comprises a full-bridge structure unit, its bridge arm comprises a fully-controlled power electronic device, and its direct current capacitor is connected in series with the diode after being connected in parallel with a second resistor; and
    each diode bridge type switch comprises a full-bridge structure unit, its bridge arm comprises a diode, and its direct current capacitor is connected in parallel with the fully-controlled power electronic device.

5. An application method of a combined direct current circuit breaker, comprising switching a working mode of the direct current circuit breaker according to a running state of a high-voltage direct current power transmission system by:
when the high-voltage direct current power transmission system runs normally, switching the direct current circuit breaker into a first working mode;
when the high-voltage direct current power transmission system has a line failure, switching the direct current circuit breaker into a second working mode; and
when the high-voltage direct current power transmission system has a converter station outlet failure, switching the direct current circuit breaker into a third working mode,
wherein the combined direct current circuit breaker comprises one transfer branch, one energy absorption branch, at least two primary branches and at least two secondary branches, wherein the transfer branch is connected in parallel with the energy absorption branch; the primary branches are in one-to-one correspondence with the second branches; the primary branches are connected with direct current outgoing lines of a direct current busbar in a high-voltage direct current power transmission system; and the secondary branches are connected in series with the transfer branch and then connected in parallel with two ends of the primary branches corresponding to the secondary branches.

6. The application method of the combined direct current circuit breaker according to claim 5, wherein
the switching the direct current circuit breaker into the first working mode comprises:
closing quick mechanical switches of all primary branches and triggering power electronic switches of all the primary branches to be turned on;
closing quick mechanical switches of all secondary branches and latching power electronic switches of all the secondary branches; and
latching power electronic switches of the transfer branch.

7. The application method of the combined direct current circuit breaker according to claim 5, wherein an initial state of the direct current circuit breaker is that: the quick mechanical switches in all the primary branches are closed, the power electronic switches are turned on, the quick mechanical switches in all the secondary branches are closed, the power electronic switches are latched, and the power electronic switches in the transfer branch are latched;
the switching the direct current circuit breaker into the second working mode comprises:
latching the power electronic switch of the primary branch connected with a failure line, triggering the power electronic switch of the secondary branch corresponding to the primary branch to be turned on, and triggering the power electronic switches of the transfer branch to be turned on;
after a current flows through the primary branch connected with the failure line crosses zero, breaking the quick mechanical switch of the primary branch, and breaking the quick mechanical switch of the secondary branch not corresponding to the primary branch; and
after breaking opening ranges of the quick mechanical switches of the primary branch and the secondary branch withstand a transient breaking voltage, latching the power electronic switches of the transfer branch, transferring a failure current of the failure line to an energy absorption circuit, and when the failure current in the energy absorption circuit crosses zero, recovering the high-voltage direct current power transmission system to run normally.

8. The application method of the combined direct current circuit breaker according to claim 7, further comprising:
after recovering the high-voltage direct current power transmission system to run normally,
controlling the direct current circuit breaker to isolate the failure line, comprising: breaking the quick mechanical switch of the secondary branch corresponding to the primary branch connected with the failure line, closing the quick mechanical switches of the other secondary branches, and recovering the direct current circuit breaker into the initial state;
or,
controlling the direct current circuit breaker to be quickly re-switched on, comprising:
triggering the power electronic switches of the transfer branch to be turned on according to a re-switching-on instruction, and if the failure of the failure line still exists, latching the power electronic switches and isolating the failure line;
triggering the power electronic switches of the transfer branch to be turned on according to the re-switching-on instruction, and if the failure of the failure line is eliminated, closing the quick mechanical switch of the primary branch connected with the failure line, triggering its power electronic switch to be turned on, and closing the quick mechanical switches of the secondary branches not corresponding to the primary branch; and after a current flowing through the transfer branch crosses zero, latching the power electronic switches of the transfer branch and the secondary branch corresponding to the primary branch, and recovering the direct current circuit breaker into the initial state.

9. The application method of the combined direct current circuit breaker according to claim 7, wherein the initial state of the direct current circuit breaker is that: the quick mechanical switches in all the primary branches are closed, the power electronic switches are turned on, the quick mechanical switches in all the secondary branches are closed, the power electronic switches are latched, and the power electronic switches in the transfer branch are latched;
the switching the direct current circuit breaker into the third working mode comprises:
latching the power electronic switches of all the primary branches, and triggering the power electronic switches of the transfer branch and all the secondary branches to be turned on;
after a failure current of an outlet of a converter station is totally transferred to the transfer branch and the secondary branches, breaking the quick mechanical switches of all the primary branches; and
after breaking opening ranges of the quick mechanical switches withstand the transient breaking voltage, latching the power electronic switches of the transfer branch, transferring the failure current to the energy absorption circuit, and after the failure current in the energy absorption circuit crosses zero, conducting a load current of the high-voltage direct current power transmission system through the secondary branches.

10. The application method according to claim 5, wherein each primary branch comprises at least one quick mechanical switch and at least one power electronic switch connected in series, and is arranged to conduct a load current when the high-voltage direct current power transmission system normally runs;

each secondary branch comprises at least one quick mechanical switch and at least one power electronic switch connected in series, and is arranged to isolate a current and voltage between the direct current outgoing lines;

the transfer branch comprises multiple power electronic switches connected in series, and is arranged to break a failure current when the direct current outgoing line or direct current busbar or direct current converter station connected with any primary branch fails; and the energy absorption branch comprises a nonlinear resistor or a lightening arrester, and is arranged to break an overvoltage and absorb energy stored by an inductive device in the high-voltage direct current power transmission system when the direct current outgoing line or direct current busbar or direct current converter station connected with any primary branch fails.

11. The application method according to claim 10, wherein the mechanical switches comprise serial multi-break mechanical switches or multi-branch parallel mechanical switches; the serial multi-break mechanical switches comprise multiple switches connected in series, and the multi-branch parallel mechanical switches comprise multiple switches connected in parallel; and the power electronic switches are bidirectional on/off switches.

12. The application method according to claim 10, wherein the power electronic switches comprise fully-controlled device reverse-series switches, fully-controlled device reverse-parallel switches, first full-bridge switches, second full-bridge switches and diode bridge type switches;

each fully-controlled device reverse-series switch comprises two fully-controlled power electronic devices reversely connected in series, and each of the fully-controlled power electronic devices is reversely connected in parallel with a diode;

each fully-controlled reverse-parallel switch comprises two fully-controlled power electronic devices reversely connected in parallel;

each first full-bridge switch comprises a full-bridge structure unit, its bridge arm comprises a fully-controlled power electronic device, and its capacitor is connected in parallel with a first resistor;

each second full-bridge switch comprises a full-bridge structure unit, its bridge arm comprises a fully-controlled power electronic device, and its direct current capacitor is connected in series with the diode after being connected in parallel with a second resistor; and each diode bridge type switch comprises a full-bridge structure unit, its bridge arm comprises a diode, and its direct current capacitor is connected in parallel with the fully-controlled power electronic device.

* * * * *